United States Patent [19]

Taylor

[11] Patent Number: 4,521,698
[45] Date of Patent: Jun. 4, 1985

[54] MOS OUTPUT DRIVER CIRCUIT AVOIDING HOT-ELECTRON EFFECTS

[75] Inventor: Ronald T. Taylor, Dallas, Tex.

[73] Assignee: Mostek Corporation, Carrollton, Tex.

[21] Appl. No.: 446,105

[22] Filed: Dec. 2, 1982

[51] Int. Cl.³ ............... H03K 19/003; H03K 17/14; H03K 17/693
[52] U.S. Cl. .................. 307/450; 307/575; 307/297; 307/270; 307/300
[58] Field of Search ........... 307/443, 450, 451, 452, 307/453, 475, 481, 270, 574, 575, 577, 581, 584, 296 R, 297, 585, 280, 300, 579; 357/23, 37, 41

[56] References Cited

U.S. PATENT DOCUMENTS

| | | | |
|---|---|---|---|
| 4,100,438 | 7/1978 | Yokoyama | 307/304 |
| 4,347,476 | 8/1982 | Tam | 307/297 X |
| 4,384,220 | 5/1983 | Segawa et al. | 307/450 |
| 4,460,835 | 7/1984 | Masuoka | 307/296 R |

FOREIGN PATENT DOCUMENTS 142059 11/1979 Japan ..................... 307/451

Primary Examiner—Stanley D. Miller
Assistant Examiner—David R. Bertelson
Attorney, Agent, or Firm—Eric W. Petraske

[57] ABSTRACT

An output driver circuit for a Mos integrated circuit eliminates the problem of charge injection into the substrate by employing a switching circuit responsive to the voltage on the output node to control the voltage drop on the output transistor.

3 Claims, 3 Drawing Figures

MOS OUTPUT DRIVER CIRCUIT AVOIDING HOT-ELECTRON EFFECTS

DESCRIPTION

Technical Field

The field of the invention is that of Mos integrated circuits having relatively high current output driver circuits.

Background Art

It is known that when a Mos transistor is biased with a large drain-source voltage and a gate-source voltage greater than the threshold voltage, impact ionization may occur in the channel region near the drain. The holes that are produced by this ionization may drift into the substrate and then diffuse into a different portion of the circuit and interfere with sensitive circuit elements or, if the ionization current is sufficiently great, the potential of the substrate may be altered. It is known that this effect depends on the field within the Mos channel and, for a given voltage, on the length "L" that is characteristic of the process. This problem has become a significant factor with the widespread use of channel lengths less three microns with the resultant high electric field near the drain.

The prior art has either altered the processing technique to change the channel length L (conventionally referred to as the "electrical L") in the output drive circuits and/or the junction depth of the doped region; or has put two output transistors in series to reduce the voltage on each one and thus to reduce the field. Modern techniques such as D²MOSFET tend to worsen the hot-electron problem.

Changing the processing to increase the L means that the transconductance per unit width goes down and thus that the width, W, of the device must also increase. Increasing W, however, both increases the area of the output transistor and decreases its effectiveness as a driving device. Further, this modification is very process sensitive and if there are doping changes near the drain, the change in processing is likely to be ineffective since most of the electric field is concentrated near the drain region. If two output transistors are put in series, not only does each output transistor have to be at least twice as large as the original one being replaced, but the increased area also increases the gate capacitance of these devices, slowing down the circuit and requiring a higher switching current in the logic circuitry preceding the output transistors.

Disclosure of Invention

The invention relates to an output driver circuit for a Mos integrated circuit which eliminates the problem of electron injection into the substrate by means of a switching circuit for control of the voltage applied to the output transistor.

Best Mode for Carrying Out the Invention

Figure 1:
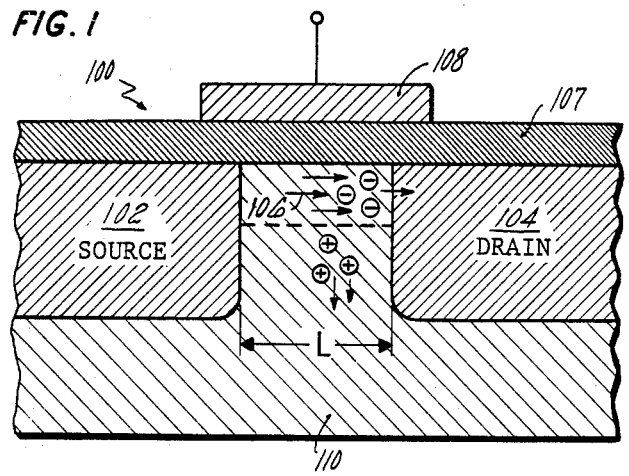
FIG. 1 illustrates a cross section of a Mos transistor.

FIG. 1 illustrates a cross section of a Mos transistor in which source 102 and drain 104 are connected by channel 106 through which electrons pass from source to drain under control of gate electrode 108 which is insulated from the source and drain by insulation layer 107. Source and drain are formed by doping substrate 110 appropriately. For a given applied voltage, typically 5 volts, the field within the channel will depend on the characteristic length L and, when L becomes less than 3 microns, the phenomenon of ionization of atoms within the substrate becomes significant. In the region of channel 106 close to drain 104, electrons become relatively energetic and a small fraction of electrons in the high energy tail of the energy distribution have sufficient energy to ionize atoms of the material within the channel. When this happens, the electrons generated by ionization are collected by drain 104 and the holes drift down into substrate 110. The motion of holes and electrons in this effect is indicated by pluses and minuses in FIG. 1.

The holes may diffuse throughout substrate 110 in a direction perpendicular to the plane of the paper, possibly reaching sensitive subcircuits within the integrated circuit and interfering with their operation. If the potential is great enough, or if the drifting hole current is great enough, the positive charge added to the substrate may be great enough to interfere with the bias on the substrate. This problem is particularly severe in the case of output drive devices of very large-scale (VLSI) circuits because of the transistor size, the bias conditions and the proximity of sensitive internal nodes close to the output transistors.

Figure 2:
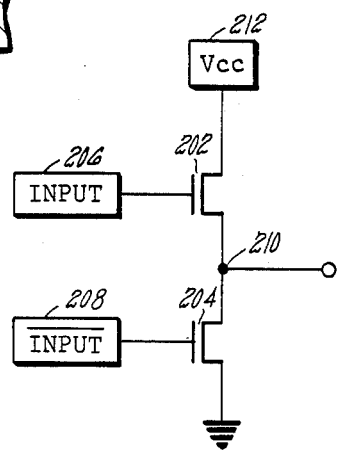
FIG. 2 illustrates an output driving circuit according to the prior art.

A schematic diagram of a prior art output circuit is illustrated in FIG. 2, in which output circuits 206 and 208 produce a signal and its complement which are applied to the gates of output transistors 202 and 204. Power supply 212 is connected through transistor 202 to output node 210, which in turn is connected through transistor 204 to ground. In a common operating condition, both output circuits 206 and 208 are at ground level so that both transistors 202 and 204 are turned off. If some external circuit causes contact 210 to go below ground by an amount greater than the threshold voltage, then transistors 204 and 202 will be turned on and will start to conduct. In particular, output transistor 202 will have a bias across it having a value of the full power supply plus the amount with which output 210 has gone below ground and the conditions for electron injection of holes into the substrate will be satisfied. In that case, leakage current from the channel of transistor 202 into the substrate will be present, giving rise to problems mentioned above.

The prior art has attempted to solve this problem in two ways, as mentioned above. The first way is to increase the characteristic length L of transistor 202, thus reducing the field associated with that voltage drop and thereby reducing the injection current. The drawbacks of this method have been mentioned above. A second method is to place two transistors 202 in series, so that each one has only half the voltage drop across it and thus has a smaller field and correspondingly smaller injection current. As has been mentioned above, this gives rise to problems with the layout of the circuit because each of the two new transistors must be at least twice as large as the former transistor 202.

Figure 3:
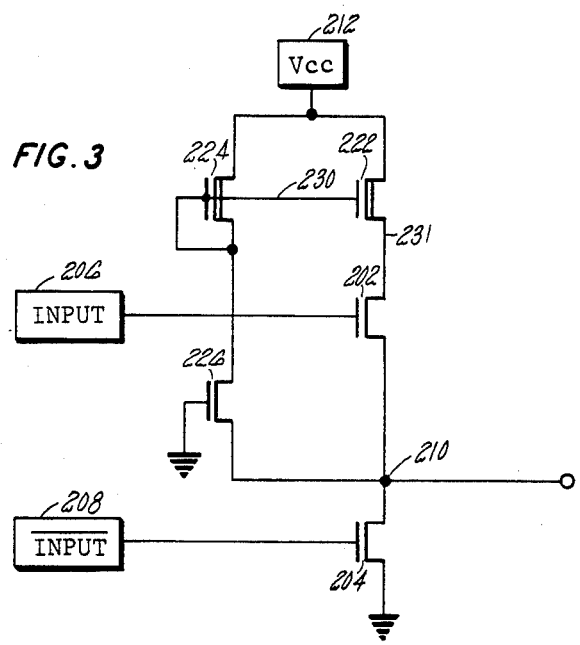
FIG. 3 illustrates an embodiment of the subject invention.

An embodiment of the invention which solves this problem is illustrated in FIG. 3, in which output circuits 206 and 208, power supply 212 and output node 210 function as before. Output transistors 202 and 204 are the same as before and three additional transistors 222, 224, and 226 have been added. Output transistor 222 is a depletion Mos transistor which is in series with output transistor 202, but since it is a depletion transistor it is much smaller than transistor 202, typically being one-third to one-half of the size of transistor 202. The two additional transistors, 224 and 226 are both very much smaller than transistors 202 or 204.

In the voltage situation described with reference to FIG. 2, when output circuits 206 and 208 are both at ground and output node 210 has been brought down below ground for some reason, transistor 202 will still be conducting, as was the case with transistor 202 of FIG. 2. However, in the circuit of FIG. 3, transistor 226 also conducts, bringing gate node 230 which is electrically tied through the gate of transistor 224 to the drain of transistor 226, down to a low voltage. Since node 230 controls depletion transistor 222, less current will pass through it and node 231 between transistor 222 and 202 will also fall to a lower voltage thereby reducing the voltage across transistor 202. Since the voltage drop across transistor 202 is low, the electric field in the channel of transistor 202 is also low and the injection current into the substrate is thereby reduced.

The magnitudes of the area of transistors 202 and 222 are chosen, as is known to those skilled in the art, so that the voltage on node 231 falls to approximately a value halfway between Vcc and the voltage on node 210. The voltage on node 231 need not be halfway, of course, so long as both transistors 202 and 222 do not have hot-electron injection. The area ratio for the transistors will depend somewhat on the processing employed, as is known in the art. In this embodiment, a ratio of 3:1 was used. Further, transistors 222, 224, and 226 are sized such that under normal operating conditions node 230 remains at the voltage of power supply 212 so that transistor 222 provides very little impedance to the flow of current into transistor 202.

Transistors 224 and 226 are conventional switching transistors and this circuit has the advantage that, as it is a switching circuit, it does not depend on the details of processing steps.

In a particular application for the output circuit of a random access memory using a 3 micron process, the length L of each transistor is 3 microns and the width W of transistors 222, 224, 226, 202, and 204 are, respectively, 350 microns, 12 microns, 60 microns, 900 microns and 900 microns. The area of the output circuit is thus increased by an amount that is less in most cases than that of the prior art method of doubling the number of transistors, since the largest of the three additional transistors is only approximately one-third the size of transistor 202.

I claim:

1. An integrated-circuit output circuit for combining logic output signals from first and second logic input terminals to control the voltage on an output node, comprising:
    a first output transistor having a first terminal connected to ground, a second terminal connected to said output node and a gate connected to said first logic input terminal; and
    a second output transistor having a first terminal connected to said output node, a second terminal connected to a power supply node and a gate connected to said second logic input terminal; characterized in that:
    a third output transistor having a gate, said third output transistor being connected between said second terminal of said second output transistor and said power supply node, and further characterized in that compensating means coupled to said output node and substantially responsive only to negative voltage on said output node for controlling said third output transistor controls said gate of said third output transistor to switch the transconductance of said third output transistor between a first transconductance when said voltage on said output node is greater than or equal to ground and a second transconductance when said voltage on said output node is less than ground.

2. A circuit according to claim 1, further characterized in that said compensating means includes a first switching transistor having a first terminal connected to said output node, a gate connected to ground and a second terminal connected to a first terminal of a second switching transistor; and
    a second switching transistor having a first terminal connected to said second terminal of said first switching transistor, a second terminal connected to said power supply node and a gate connected to said first terminal and to said gate of said third output transistor.

3. A circuit according to claim 2, further characterized in that said third output transistor and said second switching transistor are depletion MOSFET transistors.

* * * * *